(12) United States Patent
Aitken et al.

(10) Patent No.: US 8,445,394 B2
(45) Date of Patent: May 21, 2013

(54) INTERMEDIATE THERMAL EXPANSION COEFFICIENT GLASS

(75) Inventors: Bruce Gardiner Aitken, Corning, NY (US); Adam James Ellison, Painted Post, NY (US); Timothy J Kiczenski, Corning, NY (US)

(73) Assignee: Corning Incorporated, Corning, NY (US)

( * ) Notice: Subject to any disclaimer, the term of this patent is extended or adjusted under 35 U.S.C. 154(b) by 383 days.

(21) Appl. No.: 12/573,213

(22) Filed: Oct. 5, 2009

(65) Prior Publication Data

US 2010/0084016 A1 Apr. 8, 2010

Related U.S. Application Data

(60) Provisional application No. 61/103,126, filed on Oct. 6, 2008, provisional application No. 61/177,827, filed on May 13, 2009.

(51) Int. Cl.
*C03C 3/091* (2006.01)
*C03C 3/093* (2006.01)
*H01L 31/042* (2006.01)

(52) U.S. Cl.
USPC .............................. 501/66; 501/67; 136/244

(58) Field of Classification Search
USPC ................. 501/66, 67; 156/243–265
See application file for complete search history.

(56) References Cited

U.S. PATENT DOCUMENTS

| | | | |
|---|---|---|---|
| 5,631,195 A | 5/1997 | Yanagisawa et al. | 501/72 |
| 5,780,373 A | 7/1998 | Yanagisawa et al. | 501/72 |
| 5,925,583 A | 7/1999 | Yoshii et al. | 501/70 |
| 6,207,603 B1 | 3/2001 | Danielson et al. | 501/64 |
| 6,268,304 B1 * | 7/2001 | Maeda et al. | 501/65 |
| 6,319,867 B1 | 11/2001 | Chacon et al. | 501/66 |
| 6,417,124 B1 | 7/2002 | Peuchert et al. | 501/66 |
| 6,465,381 B1 | 10/2002 | Lautenschläger et al. | 501/67 |
| 6,680,266 B1 | 1/2004 | Peuchert et al. | 501/66 |
| 6,818,576 B2 * | 11/2004 | Ikenishi et al. | 501/65 |
| RE38,959 E | 1/2006 | Kohli | 428/428 |
| 6,992,030 B2 | 1/2006 | Paulson | 501/66 |
| 7,087,541 B2 | 8/2006 | Kohli | 501/70 |
| 7,153,797 B2 | 12/2006 | Peuchert | 501/66 |
| 7,297,868 B2 * | 11/2007 | Bhattacharya | 136/262 |
| 7,666,511 B2 * | 2/2010 | Ellison et al. | 428/426 |
| 2006/0006786 A1 * | 1/2006 | Fechner et al. | 313/493 |
| 2007/0193623 A1 | 8/2007 | Krasnov | 136/252 |
| 2008/0020919 A1 * | 1/2008 | Murata | 501/66 |
| 2008/0130171 A1 * | 6/2008 | Behan et al. | 360/131 |
| 2008/0206494 A1 * | 8/2008 | Kurachi et al. | 428/1.62 |
| 2008/0308146 A1 | 12/2008 | Krasnov et al. | 136/256 |
| 2009/0270242 A1 * | 10/2009 | Yanase et al. | 501/67 |
| 2009/0275462 A1 * | 11/2009 | Murata | 501/66 |
| 2010/0288351 A1 | 11/2010 | Speit et al. | 136/256 |
| 2010/0288361 A1 | 11/2010 | Rudigier-Voigt et al. | 136/261 |

FOREIGN PATENT DOCUMENTS

| | | |
|---|---|---|
| EP | 1118595 | 7/2001 |
| EP | 1878709 | 1/2008 |
| JP | 2743333 | 6/1998 |
| JP | 11-135819 | 5/1999 |
| JP | 11180727 | 7/1999 |
| JP | 11180728 | 7/1999 |
| JP | 11335133 | 7/1999 |
| JP | 11-314933 | 11/1999 |
| JP | 11310433 | 11/1999 |
| JP | 2002025762 | 1/2002 |
| JP | 2002053340 | 2/2002 |
| JP | 2003-261352 | 9/2003 |
| JP | 2003-335546 | 11/2003 |
| JP | 2004244257 | 9/2004 |
| JP | 2008280189 | 5/2007 |
| JP | 2008-069021 | 3/2008 |
| JP | 2008280189 | 11/2008 |
| JP | 2008-308343 | 12/2008 |
| WO | WO9827019 | 6/1998 |
| WO | WO2008/028599 | 3/2008 |
| WO | WO 2008099687 A1 * | 8/2008 |
| WO | WO 2008149888 A1 * | 12/2008 |

OTHER PUBLICATIONS

Machine translation of JP2008280189.

* cited by examiner

*Primary Examiner* — Karl Group
*Assistant Examiner* — Elizabeth A Bolden
(74) *Attorney, Agent, or Firm* — Tina N. Thompson; Jason A. Barron

(57) ABSTRACT

Aluminoborosilicate glasses which may be useful in photovoltaic, photochromic, electrochromic, or Organic Light Emitting Diode (OLED) lighting applications are described.

30 Claims, 1 Drawing Sheet

INTERMEDIATE THERMAL EXPANSION COEFFICIENT GLASS

This application claims the benefit of priority to U.S. Provisional Application No. 61/103,126 filed on Oct. 6, 2008 and to U.S. Provisional Application No. 61/177,827 filed on May 13, 2009.

BACKGROUND

1. Field

Embodiments relate generally to aluminoborosilicate glasses and more particularly to low alkali aluminoborosilicate glasses which may be useful in photovoltaic, photochromic, electrochromic, or Organic Light Emitting Diode (OLED) lighting applications.

2. Technical Background

The fusion forming process typically produces flat glass with optimal surface and geometric characteristics useful for many electronics applications, for instance, substrates used in electronics applications, for example, display glass for LCD televisions.

Over the last 10 years, Corning fusion glass products include 1737F™, 1737G™, Eagle2000F™, EagleXG™, Jade™, and Codes 1317 and 2317 (Gorilla Glass™). Efficient melting is generally believed to occur at a temperature corresponding to a melt viscosity of about 200 poise (p). These glasses share in common 200p temperatures in excess of 1600° C., which can translate to accelerated tank and electrode corrosion, greater challenges for fining due to still more elevated finer temperatures, and/or reduced platinum system life time, particularly around the finer. Many have temperatures at 3000 poise in excess of about 1300° C., and since this is a typical viscosity for an optical stirrer, the high temperatures at this viscosity can translate to excessive stirrer wear and elevated levels of platinum defects in the body of the glass.

Many of the above described glasses have delivery temperatures in excess of 1200° C., and this can contribute to creep of isopipe refractory materials, particularly for large sheet sizes.

These attributes combine so as to limit flow (because of slow melt rates), to accelerate asset deterioration, to force rebuilds on timescales much shorter than product lifetimes, to force unacceptable (arsenic), expensive (capsule) or unwieldy (vacuum fining) solutions to defect elimination, and thus contribute in significant ways to the cost of manufacturing glass.

In applications in which rather thick, comparatively low-cost glass with less extreme properties is required, these glasses are not only overkill, but prohibitively expensive to manufacture. This is particularly true when the competitive materials are made by the float process, a very good process for producing low cost glass with rather conventional properties. In applications that are cost sensitive, such as large-area photovoltaic panels and OLED lighting, this cost differential is so large as to make the price point of LCD-type glasses unacceptable.

To reduce such costs, it is advantageous to drive down the largest overall contributors (outside of finishing), and many of these track directly with the temperatures used in the melting and forming process. Therefore, there is a need for a glass that melts at a lower temperature than those aforementioned glasses.

Further, it would be advantageous to have a glass useful for low temperature applications, for instance, photovoltaic and OLED light applications. Further, it would be advantageous to have a glass whose processing temperatures were low enough that the manufacturing of the glass would not excessively consume the energy that these applications are aiming to save.

SUMMARY

One embodiment is a glass comprising, in mole percent:
60 to 65 percent $SiO_2$;
8 to 12 percent $Al_2O_3$;
7 to 15 percent $B_2O_3$;
greater than 0 to 8 percent $M_2O$; and
9 to 15 percent RO;
wherein, M is an alkali metal and wherein, R is an alkaline earth metal.

Such glasses address one or more of the above-mentioned disadvantages of conventional glasses and provide one or more of the following advantages: the alkalis added to the glass can greatly accelerate melting, permitting higher pull rates and lower melting temperatures. They can also raise the coefficient of thermal expansion so as to be a better match for, for example, CdTe photovoltaics.

Additional features and advantages will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawing figures.

DETAILED DESCRIPTION

Figure 1:
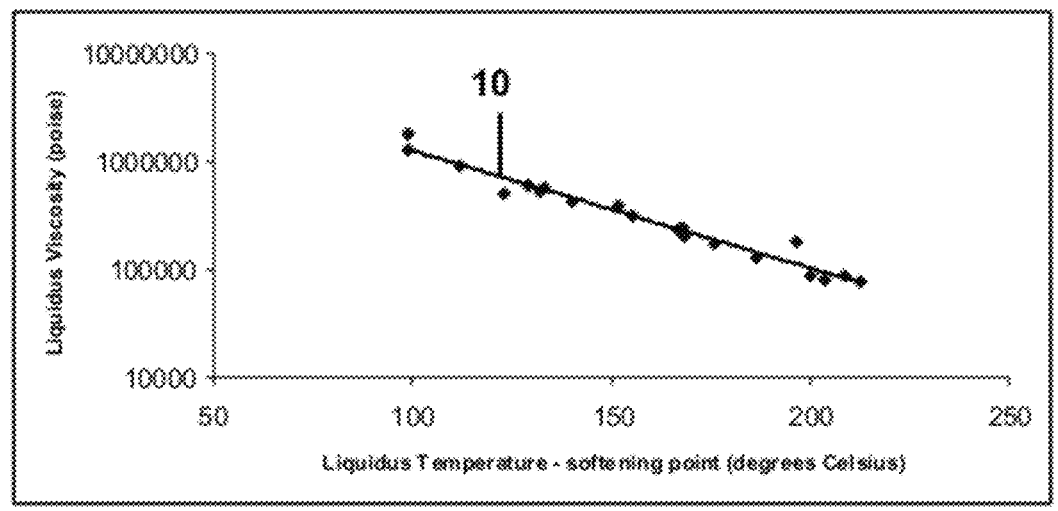
FIG. 1 is a graph of estimated liquidus viscosity.

Reference will now be made in detail to various embodiments of the invention. Wherever possible, the same reference numbers will be used throughout the drawings to refer to the same or like features.

As used herein, the term "substrate" can be used to describe either a substrate or a superstrate depending on the configuration of the photovoltaic cell. For example, the substrate is a superstrate, if when assembled into a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module.

As used herein, the term "adjacent" can be defined as being in close proximity. Adjacent structures may or may not be in physical contact with each other. Adjacent structures can have other layers and/or structures disposed between them.

As used herein, the term "planar" can be defined as having a substantially topographically flat surface.

Although exemplary numerical ranges are described in the embodiments, each of the ranges can include any numerical value including decimal places within the range including each of the ranges endpoints.

As used herein, multivalent components of the exemplary compositions are represented, for example, as $Fe_2O_3$, $SnO_2$, $As_2O_5$, $Sb_2O_5$. These materials are batched as said oxides but mixed valences or alternative valences could be used.

One embodiment is a glass comprising, in mole percent:
60 to 65 percent $SiO_2$;
8 to 12 percent $Al_2O_3$;
7 to 15 percent $B_2O_3$;
greater than 0 to 8 percent $M_2O$; and
9 to 15 percent RO;
wherein, M is an alkali metal and wherein, R is an alkaline earth metal.

Another embodiment is a glass comprising, in mole percent:
61 to 64 percent $SiO_2$;
8 to 12 percent $Al_2O_3$;
9 to 15 percent $B_2O_3$;
greater than 0 to 4 percent $M_2O$; and
12 to 15 percent RO;
wherein, M is an alkali metal and wherein, R is an alkaline earth metal.

Another embodiment is a glass comprising, in mole percent:
60 to 65 percent $SiO_2$;
8 to less than 10 percent $Al_2O_3$;
greater than 11 to 15 percent $B_2O_3$;
greater than 0 to less than 1 percent $M_2O$; and
9 to 15 percent RO;
wherein, M is an alkali metal and wherein, R is an alkaline earth metal.

Another embodiment is a glass comprising, in mole percent:
60 to 65 percent $SiO_2$;
10 to 12 percent $Al_2O_3$;
7 to 11 percent $B_2O_3$;
1 to 8 percent $M_2O$; and
9 to 15 percent RO;
wherein, M is an alkali metal and wherein, R is an alkaline earth metal.

In one embodiment, M is an alkali metal selected from Li, Na, K, Rb, Cs, and a combination thereof. In some embodiments, M is selected from Li, K, Cs, and a combination thereof.

In one embodiment, R is selected from Mg, Ca, Sr, Ba, and a combination thereof. In some embodiments, R is selected from Mg, Ca, Sr, and a combination thereof.

According to another embodiment, the glass is substantially free of BaO. For example, the content of BaO can be 0.05 mole percent or less, for example, zero mole percent.

In some embodiments, the glass is substantially free of $Sb_2O_3$, $As_2O_3$, or combinations thereof, for example, the glass comprises 0.05 mole percent or less of $Sb_2O_3$ or $As_2O_3$ or a combination thereof. For example, the glass can comprise zero mole percent of $Sb_2O_3$ or $As_2O_3$ or a combination thereof.

In some embodiments, the glass comprises 60 to 65 mole percent $SiO_2$. In some embodiments, the glass comprises 61 to 64 mole percent $SiO_2$. In some embodiments, the glass comprises 62 to 64 mole percent $SiO_2$.

In another embodiment, the glass comprises 0.01 to 0.4 mole percent $SnO_2$.

The glass according to one embodiment, comprises in mole percent:
62 to 65 percent $SiO_2$;
10 to 12 percent $Al_2O_3$;
7 to 11 percent $B_2O_3$;
3 to 8 percent MgO;
3 to 10 percent CaO;
3 to 8 percent SrO; and
1 to 8 percent $M_2O$;
wherein, M is an alkali metal selected from K, Na, and combinations thereof and wherein, CaO/(CaO+SrO) is from 0.4 to 1.

The glass, in one embodiment, is rollable. The glass, in one embodiment, is down-drawable. The glass can be slot drawn or fusion drawn, for example. According to another embodiment, the glass can be float formed.

The glass can further comprise 2 mole percent or less of $TiO_2$, MnO, ZnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, Br, $P_2O_5$, or combinations thereof.

As mentioned above, the glasses, according to some embodiments, comprise 7 to 15 mole percent, for example, 7 to 11 mole percent $B_2O_3$. $B_2O_3$ is added to the glass to reduce melting temperature, to decrease liquidus temperature, to increase liquidus viscosity, and to improve mechanical durability relative to a glass containing no $B_2O_3$.

Also as mentioned above, the glasses, according to some embodiments, 9 to 15 mole percent RO wherein, R is an alkaline earth metal. The glass can comprise, for example, 1 to 8 mole percent MgO. MgO can be added to the glass to reduce melting temperature and to increase strain point. It can disadvantageously lower CTE relative to other alkaline earths (e.g., CaO, SrO, BaO), and so other adjustments may be made to keep the CTE within the desired range. Examples of suitable adjustments include increase SrO at the expense of CaO, increasing alkali oxide concentration, and replacing a smaller alkali oxide (e.g., $Na_2O$) in whole or in part with a larger alkali oxide (e.g., $K_2O$).

The glasses, in some embodiments, comprise 1 to 9 mole percent CaO. Relative to alkali oxides or SrO, CaO contributes to higher strain point, lower density, and lower melting temperature. It is a primary component of certain possible denitrification phases, particularly anorthite ($CaAl_2Si_2O_8$), and this phase has complete solid solution with an analogous sodium phase, albite ($NaAlSi_3O_8$). High Na and Ca contents taken alone can cause liquidus temperatures to be unacceptably high. However, the chemical sources for CaO include limestone, a very inexpensive material, so to the extent that high volume and low cost are factors, it is typically useful to make the CaO content as high as can be reasonably achieved relative to other alkaline earth oxides.

The glasses can comprise, in some embodiments, 0 to 5 mole percent SrO. In certain embodiments, the glass contains no deliberately batched SrO, though it may of course be present as a contaminant in other batch materials. SrO contributes to higher coefficient of thermal expansion, and the relative proportion of SrO and CaO can be manipulated to improve liquidus temperature, and thus liquidus viscosity. SrO is not as effective as CaO or MgO for improving strain point, and replacing either of these with SrO tends to cause the melting temperature to increase.

In certain embodiments, the glass satisfies one or more of the following expressions:

$$1.0 \leq (M_2O+RO)/Al_2O_3 \leq 2; \text{ and}$$

$$0.4 \leq CaO/(CaO+SrO) \leq 1.$$

The ratio $(M_2O+RO)/Al_2O_3$ is advantageously greater than 1.0 to assist in removing bubbles from the glass during the initial melt step. This occurs because the alkali and alkaline earth metal oxides that are not involved in stabilizing $Al_2O_3$ are available to digest the silica source, typically a commercial sand. Surface area that might be sites for bubble nucleation and growth are therefore eliminated early in melting, and a comparatively bubble-free glass is obtained.

The ratio $CaO/(CaO+SrO)$ is advantageously kept between 0.4 and 1 to obtain a good balance between liquidus temperature (and hence liquidus viscosity) and melting temperature. For example, compositions with low alkali concentrations and high SrO concentrations have comparatively high melting temperatures, and if SrO is too high then liquidus temperatures may be elevated as well relative to glasses with more alkali oxide and lower SrO. However, for fixed concentrations of all other components, a local minimum in liquidus temperature is often obtained for $CaO/(CaO+SrO)$ ratios between 0.4 and 1.

Also as mentioned above, the glasses, according to some embodiments, include greater than zero to 8 mole percent $M_2O$, for example, 0.05 to 8 mole percent $M_2O$, 0.1 to 8 mole percent $M_2O$, 0.5 to 8 mole percent $M_2O$, 1 to 8 mole percent $M_2O$, where M is one or more of the alkali cations Li, Na, K, Rb and Cs. In certain embodiments, it is desirable that the alkalis in question be Li, K and Cs or combinations thereof. The alkali cations raise the CTE steeply, but also lower the strain point and, depending upon how they are added, increase melting temperatures. The least effective alkali oxide for CTE is $Li_2O$, and the most effective alkali oxide is $Cs_2O$. As noted above, sodium can participate in one of the possible denitrification phases of the inventive glasses, and while adjustments in other components can be used to counteract this, e.g., changing the $CaO/(CaO+SrO)$ ratio, this tendency may make it advantageous to replace sodium with other alkalis, or to use a mix of alkalis instead of sodium alone. If high volume and low cost are important, then it is desirable to as much as possible confine the alkali oxides to $Na_2O$ and $K_2O$ or combinations thereof.

The glasses, according to some embodiments, can further comprise a variety of other components. For example, the glasses can comprise $SnO_2$, $Fe_2O_3$, MnO, $CeO_2$, $As_2O_3$, $Sb_2O_3$, Cl, Br, or combinations thereof. These materials can be added as fining agents (e.g., to facilitate removal of gaseous inclusions from melted batch materials used to produce the glass) and/or for other purposes. In certain embodiments, the glasses comprise $SnO_2$ (e.g., as calculated in mole percent on an oxide basis, 0.02 to 0.3 $SnO_2$, etc.) and $Fe_2O_3$ (e.g., as calculated in mole percent on an oxide basis, 0.005 to 0.08 $Fe_2O_3$, 0.01 to 0.08 $Fe_2O_3$, etc.). By way of illustration, in certain embodiments, the glasses comprise $SnO_2$ and $Fe_2O_3$, wherein, in mole percent on an oxide basis:

$$0.02 \leq SnO_2 \leq 0.3; \text{ and}$$

$$0.005 \leq Fe_2O_3 \leq 0.08.$$

In certain embodiments, the glasses comprise less than 0.05% mole percent of $Sb_2O_3$, $As_2O_3$, or combinations thereof. In certain embodiments, the glasses comprise $SnO_2$, $Fe_2O_3$, $CeO_2$, Cl, Br, or combinations thereof and include less than 0.05% (e.g., less than 0.04%, less than 0.03%, less than 0.02%, less than 0.01%, etc.) mole percent of $Sb_2O_3$, $As_2O_3$, or combinations thereof. In certain embodiments, the glasses comprise $SnO_2$ and $Fe_2O_3$ and include less than 0.05 mole percent (e.g., less than 0.04 mole percent, less than 0.03 mole percent, less than 0.02 mole percent, less than 0.01 mole percent, etc.) of $Sb_2O_3$, $As_2O_3$, or combinations thereof. In certain embodiments, the glasses comprise $SnO_2$ and $Fe_2O_3$, wherein, in mole percent on an oxide basis:

$$0.02 \leq SnO_2 \leq 0.3; \text{ and}$$

$$0.005 \leq Fe_2O_3 \leq 0.08,$$

and include less than 0.05% mole percent of $Sb_2O_3$, $As_2O_3$, or combinations thereof.

The glasses, according to some embodiments, (e.g., any of the glasses discussed above) can include F, Cl, or Br, for example, as in the case where the glasses comprise Cl and/or Br as fining agents. For example, the glass can comprise fluorine, chlorine, and/or bromine, wherein, as calculated in mole percent: $F+Cl+Br \leq 0.4$, such as where $F+Cl+Br \leq 0.3$, $F+Cl+Br \leq 0.2$, $F+Cl+Br \leq 0.1$, $0.001 \leq F+Cl+Br \leq 0.4$, and/or $0.005 \leq F+Cl+Br \leq 0.4$. By way of illustration, in certain embodiments, the glass comprises $SnO_2$ and $Fe_2O_3$ and, optionally, fluorine, chlorine, and/or bromine, such that, as calculated in mole percent on an oxide basis: $0.02 \leq SnO_2 \leq 0.3$, $0.005 \leq Fe_2O_3 \leq 0.08$, and $F+Cl+Br \leq 0.4$; and, in certain embodiments, the glass comprises $SnO_2$ and $Fe_2O_3$ and, optionally, $Sb_2O_3$, $As_2O_3$, fluorine, chlorine, and/or bromine, such that, as calculated in mole percent on an oxide basis, $0.02 \leq SnO_2 \leq 0.3$, $0.005 \leq Fe_2O_3 \leq 0.08$, and $F+Cl+Br \leq 0.4$, and such that the glass includes less than 0.05 mole percent (e.g., less than 0.04, less than 0.03, less than 0.02, less than 0.01, etc.) mole percent of $Sb_2O_3$, $As_2O_3$, or combinations thereof.

The glasses, according to some embodiments, comprise BaO. In certain embodiments, the glasses comprise less than 0.1 mole percent of BaO.

The glasses, according to some embodiments, can further include contaminants as typically found in commercially prepared glass. In addition or alternatively, a variety of other oxides (e.g., $TiO_2$, MnO, ZnO, $Nb_2O_5$, $MoO_3$, $Ta_2O_5$, $WO_3$, $ZrO_2$, $Y_2O_3$, $La_2O_3$, $P_2O_5$, and the like) can be added, albeit with adjustments to other glass components, without compromising their melting or forming characteristics. In those cases where the glasses, according to some embodiments, further include such other oxide(s), each of such other oxides are typically present in an amount not exceeding 2 mole percent, and their total combined concentration is typically less than or equal to 5 mole percent, although higher amounts can be used so long as the amounts used do not place the composition outside of the ranges described above. The glasses, according to some embodiments, can also include various contaminants associated with batch materials and/or introduced into the glass by the melting, fining, and/or forming equipment used to produce the glass (e.g., $ZrO_2$).

The glass, according to some embodiments, is down-drawable; that is, the glass is capable of being formed into sheets using down-draw methods such as, but not limited to, fusion draw and slot draw methods that are known to those skilled in the glass fabrication arts. Such down-draw processes are used in the large-scale manufacture of flat glass, for example, display glass or ion-exchangeable glass.

The fusion draw process uses an isopipe that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the isopipe. These outside surfaces extend down and inwardly so that they join at an edge below the drawing tank. The two flowing glass surfaces join at this edge to fuse and form a single flowing sheet. The fusion draw method offers the advantage that, since the two glass films flowing over the channel fuse together, neither outside surface of the resulting glass sheet comes in contact with any part of the apparatus. Thus, the surface properties are not affected by such contact.

The slot draw method is distinct from the fusion draw method. Here the molten raw material glass is provided to a conduit. The bottom of the conduit has an open slot that is wider in one dimension than the other dimension with a nozzle that extends the length of the slot. The molten glass flows through the slot/nozzle and is drawn downward as a continuous sheet therethrough and into an annealing region. Compared to the fusion draw process, the slot draw process provides a thinner sheet, as only a single sheet is drawn through the slot, rather than two sheets being fused together, as in the fusion down-draw process.

In order to be compatible with down-draw processes, the aluminoborosilicate glass described herein has a high liquidus viscosity. In one embodiment, the glass has a liquidus viscosity of 50,000 poise or greater, for example, 150,000 poise or greater, for example, greater than or equal to 500,000 poise. The liquidus viscosities of the glasses are very closely correlated with the difference between the liquidus temperature and the softening point. This correlation is indicated by line 10 in FIG. 1. For downdraw processes, the glasses preferably have liquidus—softening point less than about 230° C., more preferably less than 200° C.

Accordingly, in one embodiment, the glass has a strain point of 600° C. or greater, for example, 620° C. or greater. In some embodiments, the glass has a coefficient of thermal expansion of $38\times10^{-7}$ or greater, for example, $40\times10^{-7}$ or greater, for example, $45\times10^{-7}$ or greater.

The glass according to one embodiment can have a strain point of 620° C. or greater and/or a coefficient of thermal expansion of $45\times10^{-7}$ or greater.

According to one embodiment, the glass is ion exchanged in a salt bath comprising one or more salts of alkali ions. The glass can be ion exchanged to change its mechanical properties. For example, smaller alkali ions, such as lithium or sodium, can be ion-exchanged in a molten salt containing one or more larger alkali ions, such as sodium, potassium, rubidium or cesium. If performed at a temperature well below the strain point for sufficient time, a diffusion profile will form in which the larger alkali moves into the glass surface from the salt bath, and the smaller ion is moved from the interior of the glass into the salt bath. When the sample is removed, the surface will go under compression, producing enhanced toughness against damage. Such toughness may be desirable in instances where the glass will be exposed to adverse environmental conditions, such as photovoltaic grids exposed to hail. A large alkali already in the glass can also be exchanged for a smaller alkali in a salt bath. If this is performed at temperatures close to the strain point, and if the glass is removed and its surface rapidly reheated to high temperature and rapidly cooled, the surface of the glass will show considerable compressive stress introduced by thermal tempering. This will also provide protection against adverse environmental conditions. It will be clear to one skilled in the art that any monovalent cation can be exchanged for alkalis already in the glass, including copper, silver, thallium, etc., and these also provide attributes of potential value to end uses, such as introducing color for lighting or a layer of elevated refractive index for light trapping.

According to another embodiment, the glass can be float formed as known in the art of float forming glass.

In one embodiment, the glass is in the form of a sheet. The glass in the form of a sheet can be thermally tempered.

In one embodiment, an Organic Light Emitting Diode device comprises the glass in the form of a sheet.

In one embodiment, a photovoltaic device comprises the glass in the form of a sheet. The photovoltaic device can comprise more than one of the glass sheets, for example, as a substrate and/or as a superstrate. In one embodiment, the glass sheet is substantially planar. According to one embodiment, the glass sheet is transparent.

According to some embodiments, the glass sheet has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass sheet can have a thickness of any numerical value including decimal places in the range of from 0.1 mm up to and including 4.0 mm.

In another embodiment, the photovoltaic device comprising a glass sheet and an active photovoltaic medium adjacent to the glass sheet.

The active photovoltaic medium can comprise multiple layers, for example, an amorphous silicon layer and a microcrystalline silicon layer.

In one embodiment, the active photovoltaic medium comprises cadmium telluride, copper indium gallium diselenide, amorphous silicon, crystalline silicon, microcrystalline silicon, or combinations thereof.

Figure 2:
FIG. 2 is an illustration of features of a photovoltaic device according to one embodiment.

Another embodiment, as shown in FIG. 2 features 200 of a photovoltaic device comprising a glass sheet 12 comprising any of the glass compositions previously described and an active photovoltaic medium 16 adjacent to the glass sheet, wherein the active photovoltaic medium comprises cadmium telluride. According to one embodiment, the glass sheet has a thickness as previously described. The photovoltaic device can further comprise a conductive layer 14, such as a transparent conductive oxide adjacent to or disposed on the glass sheet.

In one embodiment, an electrochromic device comprises the glass in the form of a sheet. The electrochromic device can be, for example, an electrochromic window.

EXAMPLES

The following is an example of how to fabricate a sample of an exemplary glass, according to one embodiment of the invention, as shown in Table 1. This composition corresponds to composition number 46 shown in Table 7.

TABLE 1

| oxide | mol % |
| --- | --- |
| $SiO_2$ | 63.5 |
| $Al_2O_3$ | 10.7 |
| $B_2O_3$ | 10.3 |
| $K_2O$ | 2.3 |
| MgO | 4.4 |
| CaO | 5.2 |
| SrO | 3.5 |
| $SnO_2$ | 0.1 |

In some embodiments, the total does not add up to 100%, since certain tramp elements are present at non-negligible concentrations.

Batch materials, as shown in Table 2 were weighed and added to a 4 liter plastic container:

TABLE 2

| Batch Components | batch weight |
|---|---|
| sand | 1713.42 |
| alumina | 486.27 |
| boric acid | 570.42 |
| Potassium carbonate | 143.05 |
| Magnesia | 78.62 |
| Limestone | 240.73 |
| Strontium carbonate | 234.23 |
| 10% $SnO_2$ and 90% sand | 6.92 |

It should be appreciated that in the batch, limestone, depending on the source can contain tramp elements and/or vary amounts of one or more oxides, for example, MgO and/or BaO. The sand is advantageously beneficiated so that at least 80% by mass passes 60 mesh, for example 80 mesh, for example 100 mesh. The $SnO_2$ added, in this example, was pre-mixed with sand at a level of 10% by weight so as to ensure homogeneous mixing with the other components. The bottle containing the batch materials was mounted to a tumbler and the batch materials were mixed so as to make a homogeneous batch and to break up soft agglomerates. The mixed batch was transferred to a 1800 cc platinum crucible and placed into a high-temperature ceramic backer. The platinum in its backer was loaded into a glo-bar furnace idling at a temperature of 1550° C. After 6 hours, the crucible+backer was removed and the glass melt was poured onto a cold surface, such as a steel plate, to form a patty, and then transferred to an annealer held at a temperature of 670° C. The glass patty was held at the annealer temperature for 2 hours, then cooled at a rate of 1° C. per minute to room temperature.

Table 3, Table 4, Table 5, Table 6, Table 7, and Table 8 show exemplary glasses, according to embodiments of the invention, and made according to the above example. Properties data for some glasses are also shown in Table 3, Table 4, Table 5, Table 6, Table 7, and Table 8.

In view of its low liquidus temperature of 940° C. and, hence, its extremely high liquidus viscosity in excess of 5,000,000 poise, glass 49, shown in Table 8 is an advantageous glass for applications, such as glass for photovoltaics. The exemplary glasses shown in Table 8 comprise, in mole percent:

62 to 64 percent $SiO_2$;
8 to 12 percent $Al_2O_3$;
9 to 15 percent $B_2O_3$;
greater than 0 to 4 percent $M_2O$; and
12 to 15 percent RO;
wherein, M is an alkali metal and wherein, R is an alkaline earth metal.

Further, the glasses shown in Table 8 have anneal points $\geq 640°$ C., thermal expansion coefficients (CTE) of 40-50× $10^{-7}/°$ C., 200 poise temperatures of $\leq 1550°$ C., and liquidus viscosities of $\geq 500,000$ poise. Liquidus viscosity may be dependent on the $K_2O$ content, for example, exemplary glass 49 has a maximum value in excess of 5,000,000 poise for an intermediate $K_2O$ content when compared to exemplary glasses 48, 50, and 51.

TABLE 3

| | Glass | 1 | 2 | 3 | 4 | 5 |
|---|---|---|---|---|---|---|
| Weight Percent | $SiO_2$ | 58.11 | 59.14 | 59.01 | 58.88 | 58.35 |
| | $Al_2O_3$ | 17.76 | 18.07 | 18.03 | 17.99 | 17.82 |
| | $B_2O_3$ | 9.79 | 9.96 | 9.94 | 9.92 | 9.82 |
| | MgO | 3.26 | 4.45 | 3.88 | 3.31 | 3.27 |
| | CaO | 4.03 | 4.10 | 4.87 | 5.64 | 4.04 |
| | SrO | 2.85 | 0 | 0 | 0 | 0 |
| | BaO | 0 | 0 | 0 | 0 | 0 |
| | $Na_2O$ | 3.98 | 4.05 | 4.04 | 4.03 | 3.99 |
| | $K_2O$ | 0 | 0 | 0 | 0 | 2.60 |
| | $SnO_2$ | 0.23 | 0.23 | 0.23 | 0.23 | 0.12 |
| | $Fe_2O_3$ | 0 | 0 | 0 | 0 | 0 |
| | total | 100.01 | 100 | 100 | 100 | 100.01 |
| Mole Percent | $SiO_2$ | 63.3 | 63.3 | 63.3 | 63.3 | 63.35 |
| | $Al_2O_3$ | 11.4 | 11.4 | 11.4 | 11.4 | 11.4 |
| | $B_2O_3$ | 9.2 | 9.2 | 9.2 | 9.2 | 9.2 |
| | MgO | 5.3 | 7.1 | 6.2 | 5.3 | 5.3 |
| | CaO | 4.7 | 4.7 | 5.6 | 6.5 | 4.7 |
| | SrO | 1.8 | 0 | 0 | 0 | 0 |
| | BaO | 0 | 0 | 0 | 0 | 0 |
| | $Na_2O$ | 4.2 | 4.2 | 4.2 | 4.2 | 4.2 |
| | $K_2O$ | 0 | 0 | 0 | 0 | 1.8 |
| | $SnO_2$ | 0.1 | 0.1 | 0.1 | 0.1 | 0.05 |
| | $Fe_2O_3$ | 0 | 0 | 0 | 0 | 0 |
| | total | 100 | 100 | 100 | 100 | 100 |
| Properties | strain | 593 | 598 | 606 | 597 | 588 |
| | anneal | 642 | 647 | 656 | 646 | 638 |
| | softening point | 867 | 868 | 882 | 874 | 881 |
| | CTE | 44.9 | 44 | 43.5 | 46.4 | 50.1 |
| | density | 2.447 | 2.332 | 2.414 | 2.422 | 2.393 |
| Viscosity | A | | | | −2.2233 | −2.5584 |
| | B | | | | 5556.58 | 6588.87 |
| | To | | | | 305.47 | 220.27 |
| | T @ 200 p | | | | 1533.625 | 1576.164 |
| | T @ 35 kP | | | | 1126.554 | 1147.957 |
| | T @ 250 kP | | | | 1034.561 | 1048.398 |
| | T(200 P) − T(35 kP) | | | | 407.071 | 428.206 |

TABLE 3-continued

|  |  |  |  |  |  |  |
|---|---|---|---|---|---|---|
| Resistivity | A |  |  |  | 3.0838 | 3.9616 |
|  | B |  |  |  | 1183.49 | 4266.54 |
|  | To |  |  |  | 2156.83 | 3061.95 |
|  | R @ 200 p |  |  |  | 15.30245 | 12.30353 |
| Liquidus | air | 1070 | 1090 | 1065 | 1060 | 995 |
|  | internal | 1060 | 1080 | 1060 | 1050 | 980 |
|  | Pt | 1040 | 1050 | 1030 | 1040 | 975 |
|  | phase | Albite | Albite | Albite | Albite | Albite |
|  | Liquidus viscosity |  |  |  | 173742.1 | 1300909 |
|  | Int liq - soft | 193 | 212 | 178 | 176 | 99 |
|  | estimated liquidus viscosity | 107951.5 | 64408.99 | 168454.9 | 179256.1 | 4244242 |

|  | Glass | 6 | 7 | 8 | 9 |
|---|---|---|---|---|---|
| Weight Percent | SiO$_2$ | 58.40 | 58.54 | 58.74 | 58.56 |
|  | Al$_2$O$_3$ | 17.83 | 17.88 | 17.94 | 17.88 |
|  | B$_2$O$_3$ | 9.83 | 9.85 | 9.88 | 9.85 |
|  | MgO | 3.28 | 3.91 | 4.54 | 3.62 |
|  | CaO | 4.90 | 4.05 | 4.07 | 4.46 |
|  | SrO | 0 | 0 | 0 | 0 |
|  | BaO | 0 | 0 | 0 | 0 |
|  | Na$_2$O | 3.04 | 3.05 | 2.10 | 3.34 |
|  | K$_2$O | 2.60 | 2.61 | 2.62 | 2.17 |
|  | SnO$_2$ | 0.12 | 0.12 | 0.12 | 0.12 |
|  | Fe$_2$O$_3$ | 0 | 0 | 0 | 0 |
|  | total | 100 | 100.01 | 100.01 | 100 |
| Mole Percent | SiO$_2$ | 63.35 | 63.35 | 63.35 | 63.35 |
|  | Al$_2$O$_3$ | 11.4 | 11.4 | 11.4 | 11.4 |
|  | B$_2$O$_3$ | 9.2 | 9.2 | 9.2 | 9.2 |
|  | MgO | 5.3 | 6.3 | 7.3 | 5.83 |
|  | CaO | 5.7 | 4.7 | 4.7 | 5.17 |
|  | SrO | 0 | 0 | 0 | 0 |
|  | BaO | 0 | 0 | 0 | 0 |
|  | Na$_2$O | 3.2 | 3.2 | 2.2 | 3.5 |
|  | K$_2$O | 1.8 | 1.8 | 1.8 | 1.5 |
|  | SnO$_2$ | 0.05 | 0.05 | 0.05 | 0.05 |
|  | Fe$_2$O$_3$ | 0 | 0 | 0 | 0 |
|  | total | 100 | 100 | 100 | 100 |
| Properties | strain | 592 | 601 | 613 | 594 |
|  | anneal | 643 | 652 | 663 | 646 |
|  | softening point | 885 | 890 | 901 | 883 |
|  | CTE | 47.8 | 47 | 43.7 | 47.2 |
|  | density | 2.402 | 2.401 | 2.399 | 2.401 |
| Viscosity | A |  |  |  |  |
|  | B |  |  |  |  |
|  | To |  |  |  |  |
|  | T @ 200 p |  |  |  |  |
|  | T @ 35 kP |  |  |  |  |
|  | T @ 250 kP |  |  |  |  |
|  | T(200 P) − T(35 kP) |  |  |  |  |
| Resistivity | A |  |  |  |  |
|  | B |  |  |  |  |
|  | To |  |  |  |  |
|  | R @ 200 p |  |  |  |  |
| Liquidus | air | 1050 | 1040 | 1115 | 1030 |
|  | internal | 1040 | 1030 | 1105 | 1020 |
|  | Pt | 1020 | 1015 | 1075 | 1000 |
|  | phase | Albite | Albite | Albite | Albite |
|  | Liquidus viscosity |  |  |  |  |
|  | Int liq - soft | 155 | 140 | 204 | 137 |
|  | estimated liquidus viscosity | 360553.2 | 631087.4 | 79584.37 | 710936.1 |

TABLE 4

|  | Glass | 10 | 11 | 12 | 13 | 14 |
|---|---|---|---|---|---|---|
| Weight Percent | SiO$_2$ | 58.78 | 57.16 | 57.49 | 57.83 | 58.17 |
|  | Al$_2$O$_3$ | 17.95 | 17.46 | 17.56 | 17.66 | 17.76 |
|  | B$_2$O$_3$ | 9.89 | 9.62 | 9.67 | 9.73 | 9.79 |
|  | MgO | 3.96 | 3.21 | 3.48 | 3.76 | 4.04 |
|  | CaO | 4.88 | 3.96 | 4.34 | 4.72 | 5.11 |
|  | SrO | 0 | 0 | 0 | 0 | 0 |
|  | BaO | 0 | 0 | 0 | 0 | 0 |

TABLE 4-continued

|  |  |  |  |  |  |  |
|---|---|---|---|---|---|---|
|  | Na$_2$O | 2.68 | 0 | 0 | 0 | 0 |
|  | K$_2$O | 1.75 | 8.49 | 7.34 | 6.18 | 5.01 |
|  | SnO$_2$ | 0.12 | 0.11 | 0.11 | 0.11 | 0.12 |
|  | Fe$_2$O$_3$ | 0 | 0 | 0 | 0 | 0 |
|  | total | 100.01 | 100.01 | 99.99 | 99.99 | 100 |
| Mole Percent | SiO$_2$ | 63.35 | 63.35 | 63.35 | 63.35 | 63.35 |
|  | Al$_2$O$_3$ | 11.40 | 11.40 | 11.40 | 11.40 | 11.40 |
|  | B$_2$O$_3$ | 9.20 | 9.20 | 9.20 | 9.20 | 9.20 |
|  | MgO | 6.36 | 5.30 | 5.72 | 6.14 | 6.56 |
|  | CaO | 5.64 | 4.70 | 5.12 | 5.54 | 5.96 |
|  | SrO | 0 | 0 | 0 | 0 | 0 |
|  | BaO | 0 | 0 | 0 | 0 | 0 |
|  | Na$_2$O | 2.80 | 0 | 0 | 0 | 0 |
|  | K$_2$O | 1.20 | 6.00 | 5.16 | 4.32 | 3.48 |
|  | SnO$_2$ | 0.05 | 0.05 | 0.05 | 0.05 | 0.05 |
|  | Fe$_2$O$_3$ | 0 | 0 | 0 | 0 | 0 |
|  | total | 100 | 100 | 100 | 100 | 100 |
| Properties | strain | 604 | 608 | 621 | 624 | 632 |
|  | anneal | 655 | 661 | 674 | 675 | 685 |
|  | softening point | 885 | 914 | 911 | 916 | 925 |
|  | CTE | 44.5 | 52.1 | 48.9 | 45.6 | 44.1 |
|  | density | 2.411 | 2.382 | 2.389 | 2.393 | 2.397 |
| Viscosity | A |  |  |  | −2.7798 | −2.7896 |
|  | B |  |  |  | 6788.52 | 6506.53 |
|  | To |  |  |  | 263.53 | 291.74 |
|  | T @ 200 p |  |  |  | 1599.635 | 1569.878 |
|  | T @ 35 kP |  |  |  | 1190.434 | 1178.954 |
|  | T @ 250 kP |  |  |  | 1093.652 | 1086.427 |
|  | T(200 P) − T(35 kP) |  |  |  | 409.2009 | 390.9249 |
| Resistivity | A |  |  |  | −2.6974 | −3.1433 |
|  | B |  |  |  | 7362.61 | 7835.22 |
|  | To |  |  |  | −175.21 | −98.68 |
|  | R @ 200 p |  |  |  | 28.24312 | 35.68633 |
| Liquidus | air | 1040 | 990 | 980 | 1030 | 1070 |
|  | internal | 1030 | 980 | 970 | 1015 | 1065 |
|  | Pt | 1005 | 965 | 960 | 1000 | 1050 |
|  | phase | Albite | Orthoclase | Orthoclase | Cordierite | Cordierite |
|  | Liquidus viscosity |  |  |  | 1794130.5 | 421516.23 |
|  | Int liq − soft | 145 | 66 | 59 | 99 | 140 |
|  | estimated liquidus viscosity | 520319.01 | 39473174.9 | 73132031.9 | 4244242 | 631087.4 |

|  |  | Glass | 15 | 16 | 17 | 18 | 19 |
|---|---|---|---|---|---|---|---|
| Weight Percent | SiO$_2$ |  | 58.52 | 58.87 | 58.17 | 58.33 | 58.51 |
|  | Al$_2$O$_3$ |  | 17.87 | 17.98 | 17.76 | 17.81 | 17.87 |
|  | B$_2$O$_3$ |  | 9.85 | 9.91 | 9.79 | 9.82 | 9.84 |
|  | MgO |  | 4.33 | 4.61 | 4.04 | 4.05 | 4.06 |
|  | CaO |  | 5.50 | 5.90 | 5.11 | 5.54 | 5.99 |
|  | SrO |  | 0 | 0 | 0 | 0 | 0 |
|  | BaO |  | 0 | 0 | 0 | 0 | 0 |
|  | Na$_2$O |  | 0 | 0 | 0 | 0 | 0 |
|  | K$_2$O |  | 3.82 | 2.62 | 5.01 | 4.33 | 3.62 |
|  | SnO$_2$ |  | 0.12 | 0.12 | 0.12 | 0.12 | 0.12 |
|  | Fe$_2$O$_3$ |  | 0 | 0 | 0 | 0 | 0 |
|  | total |  | 100.01 | 100.01 | 100 | 100 | 100.01 |
| Mole Percent | SiO$_2$ |  | 63.35 | 63.35 | 63.35 | 63.35 | 63.35 |
|  | Al$_2$O$_3$ |  | 11.40 | 11.40 | 11.40 | 11.40 | 11.40 |
|  | B$_2$O$_3$ |  | 9.20 | 9.20 | 9.20 | 9.20 | 9.20 |
|  | MgO |  | 6.98 | 7.40 | 6.56 | 6.55 | 6.55 |
|  | CaO |  | 6.38 | 6.80 | 5.96 | 6.45 | 6.95 |
|  | SrO |  | 0 | 0 | 0 | 0 | 0 |
|  | BaO |  | 0 | 0 | 0 | 0 | 0 |
|  | Na$_2$O |  | 0 | 0 | 0 | 0 | 0 |
|  | K$_2$O |  | 2.64 | 1.80 | 3.48 | 3.00 | 2.50 |
|  | SnO$_2$ |  | 0.05 | 0.05 | 0.05 | 0.05 | 0.05 |
|  | Fe$_2$O$_3$ |  | 0 | 0 | 0 | 0 | 0 |
|  | total |  | 100 | 100 | 100 | 100 | 100 |
| Properties | strain |  | 631 | 639 | 630 | 630 | 635 |
|  | anneal |  | 683 | 689 | 683 | 682 | 687 |
|  | softening point |  | 914 | 913 | 921 | 918 | 922 |
|  | CTE |  | 41.5 | 39.6 | 43.3 | 41.6 | 40.4 |
|  | density |  | 2.412 | 2.43 | 2.4 | 2.404 | 2.408 |

TABLE 4-continued

|  |  |  |  |  |  |  |
|---|---|---|---|---|---|---|
| Viscosity | A | | | | | |
|  | B | | | | | |
|  | To | | | | | |
|  | T @ 200 p | | | | | |
|  | T @ 35 kP | | | | | |
|  | T @ 250 kP | | | | | |
|  | T(200 P) – T(35 kP) | | | | | |
| Resistivity | A | | | | | |
|  | B | | | | | |
|  | To | | | | | |
|  | R @ 200 p | | | | | |
| Liquidus | air | 1110 | 1135 | 1085 | 1070 | 1075 |
|  | internal | 1100 | 1125 | 1070 | 1065 | 1060 |
|  | Pt | 1080 | 1105 | 1060 | 1050 | 1045 |
|  | phase | Cordierite | Cordierite | Cordierite | Cordierite | Cordierite |
|  | Liquidus viscosity | | | | | |
|  | Int liq - soft | 186 | 212 | 149 | 147 | 138 |
|  | estimated liquidus viscosity | 132273.398 | 64408.987 | 447990.94 | 482556.71 | 683059.804 |

TABLE 5

|  | Glass | 20 | 21 | 22 | 23 | 24 |
|---|---|---|---|---|---|---|
| Weight Percent | $SiO_2$ | 57.49 | 57.65 | 57.82 | 58.47 | 57.78 |
|  | $Al_2O_3$ | 17.55 | 17.6 | 17.65 | 17.86 | 17.64 |
|  | $B_2O_3$ | 10.85 | 10.88 | 10.91 | 9.84 | 10.9 |
|  | MgO | 4 | 4 | 4.02 | 4.06 | 4.02 |
|  | CaO | 5.04 | 5.48 | 5.92 | 5.99 | 5.92 |
|  | SrO | 0 | 0 | 0 | 0 | 0 |
|  | BaO | 0 | 0 | 0 | 0 | 0 |
|  | $Na_2O$ | 0 | 0 | 0 | 0 | 0 |
|  | $K_2O$ | 4.95 | 4.28 | 3.57 | 3.62 | 3.57 |
|  | $SnO_2$ | 0.12 | 0.12 | 0.12 | 0.16 | 0.16 |
|  | $Fe_2O_3$ | 0 | 0 | 0 | 0 | 0 |
|  | total | 100 | 100.01 | 100.01 | 100 | 99.99 |
| Mole Percent | $SiO_2$ | 62.65 | 62.65 | 62.65 | 63.33 | 62.63 |
|  | $Al_2O_3$ | 11.27 | 11.27 | 11.27 | 11.40 | 11.27 |
|  | $B_2O_3$ | 10.20 | 10.20 | 10.20 | 9.20 | 10.20 |
|  | MgO | 6.50 | 6.48 | 6.49 | 6.55 | 6.49 |
|  | CaO | 5.89 | 6.38 | 6.87 | 6.95 | 6.87 |
|  | SrO | 0 | 0 | 0 | 0 | 0 |
|  | BaO | 0 | 0 | 0 | 0 | 0 |
|  | $Na_2O$ | 0 | 0 | 0 | 0 | 0 |
|  | $K_2O$ | 3.44 | 2.97 | 2.47 | 2.50 | 2.47 |
|  | $SnO_2$ | 0.05 | 0.05 | 0.05 | 0.07 | 0.07 |
|  | $Fe_2O_3$ | 100 | 100 | 100 | 100 | 100 |
|  | total | | | | | |
| Properties | strain | 623 | 630 | 632 | 637 | 630 |
|  | anneal | 673 | 680 | 682 | 688 | 680 |
|  | softening point | 916 | 913 | 914 | 922 | 918 |
|  | CTE | 43.7 | 42.2 | 40.3 | 41.1 | 41 |
|  | density | 2.394 | 2.395 | 2.401 | 2.411 | 2.405 |
| Viscosity | A | | | | −2.826 | −2.7517 |
|  | B | | | | 6611.93 | 6318.79 |
|  | To | | | | 284.22 | 304.73 |
|  | T @ 200 p | | | | 1573.842 | 1555.299 |
|  | T @ 35 kP | | | | 1181.353 | 1170.820 |
|  | T @ 250 kP | | | | 1088.206 | 1080.076 |
|  | T(200 P) – T(35 kP) | | | | 392.489 | 384.480 |
| Resistivity | A | | | | −4.9927 | −2.6521 |
|  | B | | | | 13663.94 | 5980.3 |
|  | To | | | | −556.65 | 129.56 |
|  | R @ 200 p | | | | 26.35204 | 34.86784 |
| Liquidus | air | 1040 | 1050 | 1065 | 1060 | 1040 |
|  | internal | 1035 | 1045 | 1050 | 1055 | 1030 |
|  | Pt | 1020 | 1025 | 1030 | 1040 | 1020 |
|  | phase | Cordierite | Cordierite | Cordierite | Cordierite | Cordierite |
|  | Liquidus viscosity | | | | 565239.4 | 913330.2 |
|  | Int liq - soft | 119 | 132 | 136 | 133 | 112 |
|  | estimated liquidus viscosity | 1542714 | 872242.2 | 740167 | 836776.9 | 2153251 |

TABLE 5-continued

| | Glass | 25 | 26 | 27 | 28 |
|---|---|---|---|---|---|
| Weight Percent | SiO$_2$ | 58.61 | 57.36 | 56.92 | 58.14 |
| | Al$_2$O$_3$ | 17.27 | 17.51 | 17.39 | 17.03 |
| | B$_2$O$_3$ | 9.86 | 10.82 | 10.74 | 10.45 |
| | MgO | 4 | 3.98 | 3.96 | 3.85 |
| | CaO | 6.3 | 6.61 | 7.31 | 5.67 |
| | SrO | 0 | 0 | 0 | 0 |
| | BaO | 0 | 0 | 0 | 0 |
| | Na$_2$O | 0 | 0 | 0 | 0 |
| | K$_2$O | 3.84 | 3.55 | 3.52 | 4.69 |
| | SnO$_2$ | 0.12 | 0.16 | 0.16 | 0.16 |
| | Fe$_2$O$_3$ | 0 | 0 | 0 | 0 |
| | total | 100 | 99.99 | 100 | 99.99 |
| Mole Percent | SiO$_2$ | 63.35 | 62.10 | 61.55 | 63.15 |
| | Al$_2$O$_3$ | 11.00 | 11.17 | 11.08 | 10.90 |
| | B$_2$O$_3$ | 9.20 | 10.11 | 10.02 | 9.8 |
| | MgO | 6.45 | 6.43 | 6.38 | 6.23 |
| | CaO | 7.30 | 7.67 | 8.47 | 6.60 |
| | SrO | 0 | 0 | 0 | 0 |
| | BaO | 0 | 0 | 0 | 0 |
| | Na$_2$O | 0 | 0 | 0 | 0 |
| | K$_2$O | 2.65 | 2.45 | 2.43 | 3.25 |
| | SnO$_2$ | 0.05 | 0.07 | 0.07 | 0.07 |
| | Fe$_2$O$_3$ | | | | |
| | total | 100 | 100 | 100 | 100 |
| Properties | strain | 633 | 628 | 630 | 624 |
| | anneal | 683 | 677 | 677 | 674 |
| | softening point | 918 | 907 | 901 | 911 |
| | CTE | 41.9 | 42 | 43.2 | 44.1 |
| | density | 2.412 | 2.414 | 2.424 | 2.404 |
| Viscosity | A | −2.6477 | −3.0308 | −2.8977 | −3.0702 |
| | B | 6160.22 | 6642.81 | 6307 | 6906.16 |
| | To | 314.38 | 271.68 | 291.74 | 253.21 |
| | T @ 200 p | 1559.188 | 1517.558 | 1504.921 | 1538.979 |
| | T @ 35 kP | 1170.945 | 1148.634 | 1139.254 | 1160.212 |
| | T @ 250 kP | 1080.039 | 1059.794 | 1052.019 | 1068.756 |
| | T(200 P) − T(35 kP) | 388.243 | 368.924 | 365.667 | 378.766 |
| Resistivity | A | −2.6628 | −2.9715 | −2.7071 | −3.4632 |
| | B | 6172.99 | 6668.56 | 5845.08 | 8147.16 |
| | To | 100.8 | 50.95 | 149.34 | −101.76 |
| | R @ 200 p | 37.14907 | 37.62072 | 40.24979 | 31.79388 |
| Liquidus | air | 1065 | 1060 | 1025 | 1010 |
| | internal | 1050 | 1050 | 1015 | 1000 |
| | Pt | 1040 | 1030 | 1000 | 990 |
| | phase | Anorthite | Anorthite | Anorthite | Anorthite |
| | Liquidus viscosity | 532706.2 | 319158 | 664567.2 | 1505199 |
| | Int liq - soft | 132 | 143 | 114 | 89 |
| | estimated liquidus viscosity | 872242.2 | 561623.8 | 1953516 | 7623399 |

TABLE 6

| | Glass | 29 | 30 | 31 | 32 | 33 | 34 | 35 | 36 | 37 | 38 |
|---|---|---|---|---|---|---|---|---|---|---|---|
| Weight Percent | SiO$_2$ | 56.19 | 56.33 | 56.46 | 56.6 | 56.72 | 56.48 | 57.32 | 58.17 | 57.29 | 56.92 |
| | Al$_2$O$_3$ | 17.45 | 17.01 | 16.56 | 16.11 | 15.66 | 17.77 | 17.52 | 17.27 | 17.03 | 16.63 |
| | B$_2$O$_3$ | 11.27 | 10.63 | 9.98 | 9.33 | 8.68 | 11.17 | 9.70 | 8.21 | 9.26 | 9.38 |
| | MgO | 2.78 | 2.61 | 2.43 | 2.26 | 2.08 | 2.76 | 2.39 | 2.01 | 2.27 | 2.29 |
| | CaO | 4.62 | 4.36 | 4.10 | 3.84 | 3.58 | 4.57 | 3.94 | 3.31 | 3.77 | 3.84 |
| | SrO | 5.83 | 5.52 | 5.20 | 4.89 | 4.57 | 5.76 | 5.00 | 4.23 | 4.79 | 4.88 |
| | BaO | 0 | 0 | 0 | 0 | 0 | 0 | 0 | 0 | 0 | 0 |
| | Na$_2$O | 1.68 | 3.37 | 5.06 | 6.77 | 8.48 | 1.30 | 3.92 | 6.56 | 5.39 | 5.86 |
| | K$_2$O | 0 | 0 | 0 | 0 | 0 | 0 | 0 | 0 | 0 | 0 |
| | SnO$_2$ | 0.18 | 0.18 | 0.21 | 0.21 | 0.23 | 0.18 | 0.20 | 0.23 | 0.21 | 0.21 |
| | Fe$_2$O$_3$ | 0 | 0 | 0 | 0 | 0 | 0 | 0 | 0 | 0 | 0 |
| | total | 100 | 100.01 | 100 | 100.01 | 100 | 99.99 | 99.99 | 99.99 | 100.01 | 100.01 |
| Mole Percent | SiO$_2$ | 62.18 | 62.16 | 62.14 | 62.12 | 62.10 | 62.56 | 63.28 | 64.00 | 63.08 | 62.60 |
| | Al$_2$O$_3$ | 11.38 | 11.06 | 10.74 | 10.42 | 10.10 | 11.60 | 11.40 | 11.20 | 11.05 | 10.78 |
| | B$_2$O$_3$ | 10.76 | 10.12 | 9.48 | 8.84 | 8.20 | 10.68 | 9.24 | 7.80 | 8.80 | 8.90 |
| | MgO | 4.58 | 4.29 | 3.99 | 3.70 | 3.40 | 4.56 | 3.93 | 3.30 | 3.72 | 3.75 |
| | CaO | 5.48 | 5.16 | 4.84 | 4.52 | 4.20 | 5.42 | 4.66 | 3.90 | 4.45 | 4.52 |
| | SrO | 3.74 | 3.53 | 3.32 | 3.11 | 2.90 | 3.70 | 3.20 | 2.70 | 3.06 | 3.11 |
| | BaO | 0 | 0 | 0 | 0 | 0 | 0 | 0 | 0 | 0 | 0 |
| | Na$_2$O | 1.80 | 3.60 | 5.40 | 7.20 | 9.00 | 1.40 | 4.20 | 7.00 | 5.75 | 6.25 |

TABLE 6-continued

| | Glass | 29 | 30 | 31 | 32 | 33 | 34 | 35 | 36 | 37 | 38 |
|---|---|---|---|---|---|---|---|---|---|---|---|
| | K$_2$O | 0 | 0 | 0 | 0 | 0 | 0 | 0 | 0 | 0 | 0 |
| | SnO$_2$ | 0.08 | 0.08 | 0.09 | 0.09 | 0.10 | 0.08 | 0.09 | 0.10 | 0.09 | 0.09 |
| | Fe$_2$O$_3$ | 0 | 0 | 0 | 0 | 0 | 0 | 0 | 0 | 0 | 0 |
| | total | 100 | 100 | 100 | 100 | 100 | 100 | 100 | 100 | 100 | 100 |
| Properties | strain | 611 | 590 | 578 | 565 | | 620 | 589 | 577 | 577 | 576 |
| | anneal | 659 | 636 | 622 | 607 | 780 | 670 | 635 | 623 | 625 | 621 |
| | softening point | 887.1 | 856.5 | 831.1 | 807.2 | 780 | 899.5 | 866.3 | 850.5 | 843 | 836.1 |
| | CTE | 41.6 | 47.7 | 53.9 | 59.6 | | 40.4 | 48.1 | 56.6 | 52.8 | 55.4 |
| | density | 2.478 | 2.48 | 2.492 | 2.494 | 2.501 | 2.472 | 2.467 | 2.463 | 2.472 | 2.478 |
| Viscosity | A | −2.475 | −2.209 | −2.175 | −2.086 | −1.813 | | −2.817 | | −2.501 | −1.845 |
| | B | 5764.2 | 5523.2 | 5563.1 | 5506.2 | 4988.5 | | 6843.6 | | 6402.1 | 5180.5 |
| | To | 306 | 290.2 | 258.9 | 231 | 242.7 | | 193.3 | | 197.4 | 272 |
| | 200 | 1512.9 | 1514.85 | 1501.76 | 1486.11 | 1455.26 | | 1530.46 | | 1530.61 | 1521.51 |
| | 3000 | 1274.43 | 1261.55 | 1243.15 | 1220.77 | 1185.68 | | 1280.6 | | 1268.32 | 1245.39 |
| | 30000 | 1135.13 | 1116.27 | 1095.19 | 1069.96 | 1035.77 | | 1131.54 | | 1114.85 | 1091.42 |
| | 50000 | 1109.49 | 1089.74 | 1068.2 | 1042.53 | 1008.75 | | 1103.84 | | 1086.58 | 1063.64 |
| Liquidus | internal | 1010 | 1025 | 1040 | 1020 | 980 | 1030 | 1020 | 1070 | 1010 | 1040 |
| | Liquidus viscosity | 516159.7 | 203050.1 | 88539.17 | 78110.11 | 89722.76 | | | | 238527.3 | 79513.84 |
| | Int liq − soft | 122.9 | 168.5 | 208.9 | 212.8 | 200 | 130.5 | 153.7 | 219.5 | 167 | 203.9 |

TABLE 7

| | Glass | 39 | 40 | 41 | 42 | 43 | 44 | 45 | 46 | 47 |
|---|---|---|---|---|---|---|---|---|---|---|
| Weight Percent | SiO$_2$ | 56.76 | 57.00 | 57.33 | 57.72 | 58.11 | 59.01 | 56.88 | 57.06 | 57.30 |
| | Al$_2$O$_3$ | 17.19 | 16.95 | 17.52 | 17.64 | 17.76 | 15.66 | 17.09 | 16.32 | 17.52 |
| | B$_2$O$_3$ | 10.19 | 9.6 | 9.66 | 9.72 | 9.79 | 9.84 | 10.20 | 10.72 | 9.70 |
| | MgO | 2.50 | 2.35 | 2.37 | 2.81 | 3.26 | 2.45 | 2.56 | 2.65 | 2.39 |
| | CaO | 4.17 | 3.92 | 3.97 | 4.00 | 4.03 | 4.01 | 4.15 | 4.36 | 3.94 |
| | SrO | 5.24 | 4.98 | 5.00 | 3.93 | 2.85 | 5.04 | 5.16 | 5.42 | 5.00 |
| | BaO | 0 | 0 | 0 | 0 | 0 | 0 | 0 | 0 | 0 |
| | Na$_2$O | 3.74 | 4.99 | 3.92 | 3.95 | 3.98 | 3.77 | 3.74 | 0 | 3.92 |
| | K$_2$O | 0 | 0 | 0 | 0 | 0 | 0 | 0 | 3.24 | 0 |
| | SnO$_2$ | 0.20 | 0.20 | 0.23 | 0.23 | 0.23 | 0.23 | 0.23 | 0.23 | 0.23 |
| | Fe$_2$O$_3$ | 0 | 0 | 0 | 0 | 0 | 0 | 0 | 0 | 0 |
| | total | 99.99 | 99.99 | 100 | 100 | 100.01 | 100.01 | 100.01 | 100 | 100 |
| Mole Percent | SiO$_2$ | 62.63 | 62.78 | 63.3 | 63.3 | 63.30 | 64.6 | 62.7 | 63.50 | 63.28 |
| | Al$_2$O$_3$ | 11.18 | 11.00 | 11.40 | 11.40 | 11.40 | 10.10 | 11.10 | 10.70 | 11.40 |
| | B$_2$O$_3$ | 9.70 | 9.13 | 9.20 | 9.20 | 9.20 | 9.30 | 9.70 | 10.30 | 9.24 |
| | MgO | 4.12 | 3.86 | 3.90 | 4.60 | 5.30 | 4.00 | 4.20 | 4.40 | 3.93 |
| | CaO | 4.93 | 4.63 | 4.70 | 4.70 | 4.70 | 4.70 | 4.90 | 5.20 | 4.66 |
| | SrO | 3.35 | 3.18 | 3.20 | 2.50 | 1.80 | 3.20 | 3.30 | 3.50 | 3.20 |
| | BaO | 0 | 0 | 0 | 0 | 0 | 0 | 0 | 0 | 0 |
| | Na$_2$O | 4.00 | 5.33 | 4.20 | 4.20 | 4.20 | 4.00 | 4.00 | 0.00 | 4.20 |
| | K$_2$O | 0 | 0 | 0 | 0 | 0 | 0 | 0 | 2.3 | 0 |
| | SnO$_2$ | 0.09 | 0.09 | 0.10 | 0.10 | 0.10 | 0.10 | 0.10 | 0.10 | 0.10 |
| | Fe$_2$O$_3$ | 0 | 0 | 0 | 0 | 0 | 0 | 0 | 0 | 0 |
| | total | | | | | | | | | |
| Properties | strain | 589 | 578 | 596 | 597 | 596 | 590 | 593 | 619 | 597 |
| | anneal | 638 | 626 | 643 | 644 | 645 | 637 | 640 | 669 | 645 |
| | softening point | 858.5 | 843.2 | 867.6 | 867.3 | 876.9 | 859.5 | 858.5 | 898 | 873 |
| | CTE | 48.4 | 51.7 | 48.1 | 47.3 | 46.1 | 47.6 | 48 | 44.2 | 47.2 |
| | density | 2.477 | 2.474 | 2.475 | 2.466 | 2.451 | 2.472 | 2.476 | 2.465 | 2.466 |
| Viscosity | A | −2.549 | −2.625 | | | | −2.625 | | −2.567 | |
| | B | 6218.5 | 6434.5 | | | | 6434.5 | | 6097.1 | |
| | To | 233.8 | 223.8 | | | | 223.8 | | 303.3 | |
| | 200 | 1515.96 | 1530.02 | | | | 1530.02 | | 1555.78 | |
| | 3000 | 1265.72 | 1278.27 | | | | 1278.27 | | 1312.07 | |
| | 30000 | 1118.85 | 1129.8 | | | | 1129.8 | | 1168.86 | |
| | 50000 | 1091.76 | 1102.35 | | | | 1102.35 | | 1142.43 | |
| Liquidus | internal | 1045 | 1040 | 1095 | 1080 | 1060 | 1015 | 1060 | 1050 | 1065 |
| | Liquidus viscosity | 130859 | 181336.2 | | | | 321798.1 | | 396638.1 | |
| | Int liq − soft | 186.5 | 196.8 | 227.4 | 213 | 183.1 | 155.5 | 201.5 | 152 | 192 |

TABLE 8

| | Glass | 48 | 49 | 50 | 51 |
|---|---|---|---|---|---|
| Mole Percent | $SiO_2$ | 63 | 62.95 | 62.9 | 62.85 |
| | $Al_2O_3$ | 11 | 10.3 | 9.65 | 9 |
| | $B_2O_3$ | 10.2 | 11.6 | 13.05 | 14.5 |
| | MgO | 5.5 | 4.13 | 2.75 | 1.38 |
| | CaO | 6.1 | 4.6 | 3.05 | 1.53 |
| | SrO | 1.8 | 1.43 | 1.05 | 1.68 |
| | BaO | 0 | 3.1 | 6.15 | 9.22 |
| | $K_2O$ | 2.4 | 1.8 | 1.2 | 0.6 |
| | $SnO_2$ | 0.1 | 0.1 | 0.1 | 0.1 |
| Weight Percent | $SiO_2$ | 57.2 | 54.9 | 52.9 | 51 |
| | $Al_2O_3$ | 16.9 | 15.3 | 13.8 | 12.4 |
| | $B_2O_3$ | 10.7 | 11.7 | 12.7 | 13.6 |
| | MgO | 3.34 | 2.42 | 1.55 | 0.75 |
| | CaO | 5.17 | 3.74 | 2.4 | 1.16 |
| | SrO | 2.81 | 2.16 | 1.53 | 0.95 |
| | BaO | 0 | 6.91 | 13.2 | 19.1 |
| | $K_2O$ | 3.41 | 2.47 | 1.58 | 0.76 |
| | $SnO_2$ | 0.23 | 0.22 | 0.21 | 0.2 |
| Properties | strain | 628 | 609 | 603 | 598 |
| | anneal | 678 | 659 | 651 | 644 |
| | softening | 909 | 890 | 876 | 858 |
| | CTE | 42.8 | 43.9 | 45.4 | 46 |
| | Density | 2.44 | 2.516 | 2.606 | 2.677 |
| Viscosity | 200 | 1529 | 1525 | 1528 | |
| | Internal Liquidus | 1020 | 940 | 980 | 980 |
| | Liquidus Viscosity | 822,000 | 5,233,000 | 1,100,000 | |

The alkalis in the glass according to the present invention and low melting temperature combine to accelerate melting thus enabling high volume, low-cost melting and forming relative to alkali-free alternatives while retaining competitive properties, including in particular mechanical and dimensional stability when reheated to high temperature. These glasses are well suited for large-volume sheet glass applications, particularly OLED lighting and cadmium telluride (CdTe) photovoltaics, for which thermal stability, large volumes, and low cost are desirable substrate attributes.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A glass comprising, in mole percent:
   60 to 65 percent $SiO_2$;
   8 to 12 percent $Al_2O_3$;
   7 to 15 percent $B_2O_3$;
   0.1 to 8 percent $M_2O$;
   9 to 15 percent RO; and
   0.01 to 0.4 percent $SnO_2$,
   wherein, M is an alkali metal and wherein, R is an alkaline earth metal.

2. The glass according to claim 1, comprising, in mole percent:
   61 to 64 percent $SiO_2$;
   8 to 12 percent $Al_2O_3$;
   9 to 15 percent $B_2O_3$;
   0.1 to 4 percent $M_2O$; and
   12 to 15 percent RO;
   wherein, M is an alkali metal and wherein, R is an alkaline earth metal.

3. The glass according to claim 1, comprising, in mole percent:
   60 to 65 percent $SiO_2$;
   8 to less than 10 percent $Al_2O_3$;
   greater than 11 to 15 percent $B_2O_3$;
   0.1 to less than 1 percent $M_2O$; and
   9 to 15 percent RO;
   wherein, M is an alkali metal and wherein, R is an alkaline earth metal.

4. The glass according to claim 1, comprising, in mole percent:
   60 to 65 percent $SiO_2$;
   10 to 12 percent $Al_2O_3$;
   7 to 11 percent $B_2O_3$;
   1 to 8 percent $M_2O$; and
   9 to 15 percent RO;
   wherein, M is an alkali metal and wherein, R is an alkaline earth metal.

5. The glass according to claim 1, wherein M is selected from Li, Na, K, Rb, Cs, and a combination thereof.

6. The glass according to claim 5, wherein M is selected from Li, K, Cs and a combination thereof.

7. The glass according to claim 1, wherein R is selected from Mg, Ca, Sr, Ba, and a combination thereof.

8. The glass according to claim 7, wherein R is selected from Mg, Ca, Sr, and a combination thereof.

9. The glass according to claim 1, comprising 62 to 65 percent $SiO_2$.

10. The glass according to claim 1, comprising:
    62 to 65 percent $SiO_2$;
    10 to 12 percent $Al_2O_3$;
    7 to 11 percent $B_2O_3$;
    3 to 8 percent MgO;
    3 to 9 percent CaO;
    3 to 8 percent SrO; and
    1 to 8 percent $M_2O$;
    wherein, M is an alkali metal selected from K, Na, and combinations thereof.

11. The glass according to claim 1, wherein the glass is down-drawable.

12. The glass according to claim 1, wherein the glass is slot drawn or fusion drawn.

13. The glass according to claim 1, wherein the glass is float formed.

14. The glass according to claim 1, wherein the glass is substantially free of BaO.

15. The glass according to claim 1, wherein the glass is substantially free of $Sb_2O_3$, $As_2O_3$, or combinations thereof.

16. The glass according to claim 1, wherein the glass is ion exchanged in a salt bath comprising one or more salts of alkali metal ions.

17. The glass according to claim 1, further comprising 2 mole percent or less of $TiO_2$, MnO, ZnO, $Nb_2O_5$, $MoO_3$, $Ta_2O_5$, $WO_3$, $ZrO_2$, $Y_2O_3$, $La_2O_3$, $P_2O_5$, or combinations thereof.

18. The glass according to claim 1, having a strain point of 600° C. or greater.

19. The glass according to claim 1, having a coefficient of thermal expansion of $38 \times 10^{-7}$ /° C. or greater.

20. The glass according to claim 1, having a coefficient of thermal expansion of $45 \times 10^{-7}$ /° C. or greater.

21. The glass according to claim 1, having a strain point of 620° C. or greater and a coefficient of thermal expansion of $45 \times 10^{-7}$ /° C. or greater.

22. The glass according to claim 1, having a liquidus viscosity of 50,000 poise or greater.

23. The glass according to claim 22, having a liquidus viscosity of 150,000 poise or greater.

24. The glass according to claim 1, wherein CaO/(CaO+SrO) is from 0.4 to 1.

25. The glass according to claim 1, wherein the glass is in the form of a sheet.

26. The glass according to claim 25, wherein the glass is thermally tempered.

27. An Organic Light Emitting Diode device comprising the glass according to claim 25.

28. A photovoltaic device comprising the glass according to claim 25.

29. The photovoltaic device according to claim 28, further comprising an active photovoltaic medium adjacent to the glass.

30. The photovoltaic device according to claim 29, wherein the active photovoltaic medium comprises cadmium telluride, copper indium gallium diselenide, amorphous silicon, crystalline silicon, microcrystalline silicon, or combinations thereof.

* * * * *